(12) United States Patent
Lee et al.

(10) Patent No.: US 10,082,066 B2
(45) Date of Patent: Sep. 25, 2018

(54) THERMOELECTRIC GENERATING SYSTEM FOR VEHICLE

(71) Applicant: HYUNDAI MOTOR COMPANY, Seoul (KR)

(72) Inventors: Han Saem Lee, Seoul (KR); In Woong Lyo, Suwon-si (KR); Kyong Hwa Song, Seoul (KR); Hong Kil Baek, Seoul (KR); Jin Woo Kwak, Gyeongsan-si (KR); Gyung Bok Kim, Yongin-si (KR); Byung Wook Kim, Seongnam-si (KR); Seung Woo Lee, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 122 days.

(21) Appl. No.: 15/178,211

(22) Filed: Jun. 9, 2016

(65) Prior Publication Data
US 2017/0107884 A1    Apr. 20, 2017

(30) Foreign Application Priority Data

Oct. 14, 2015  (KR) .................. 10-2015-0143635

(51) Int. Cl.
| | |
|---|---|
| *F01N 3/00* | (2006.01) |
| *F01N 3/02* | (2006.01) |
| *F01N 5/02* | (2006.01) |
| *F01N 3/20* | (2006.01) |
| *H01L 35/30* | (2006.01) |
| *F01N 9/00* | (2006.01) |
| *F01N 13/10* | (2010.01) |

(52) U.S. Cl.
CPC ............... *F01N 5/025* (2013.01); *F01N 3/20* (2013.01); *F01N 9/00* (2013.01); *H01L 35/30* (2013.01); *F01N 13/10* (2013.01); *F01N 2560/06* (2013.01); *F01N 2900/1404* (2013.01); *Y02T 10/16* (2013.01); *Y02T 10/47* (2013.01)

(58) Field of Classification Search
CPC ............... F01N 13/10; F01N 2560/06; F01N 2900/1404; F01N 3/20; F01N 5/025; F01N 9/00; H01L 35/30
USPC .......................................... 60/298, 320, 323
See application file for complete search history.

(56) References Cited

U.S. PATENT DOCUMENTS

| | | | |
|---|---|---|---|
| 6,155,042 | A | 12/2000 | Perset et al. |
| 7,467,513 | B2 | 12/2008 | Sasaki et al. |

(Continued)

FOREIGN PATENT DOCUMENTS

| | | |
|---|---|---|
| JP | 2004-332596 A | 11/2004 |
| JP | 2005-137188 A | 5/2005 |

(Continued)

*Primary Examiner* — Phutthiwat Wongwian
*Assistant Examiner* — Diem Tran
(74) *Attorney, Agent, or Firm* — McDermott Will & Emery LLP

(57) ABSTRACT

A thermoelectric generating system for a vehicle, the thermoelectric generating system includes an engine for producing power, a thermoelectric module for producing electric energy from thermal energy of an exhaust gas generated by the engine, a purifying device for purifying the exhaust gas generated by the engine, and a controller for driving the thermoelectric module when a temperature of the purifying device arrives at a predetermined operational temperature.

7 Claims, 2 Drawing Sheets

(56) References Cited

U.S. PATENT DOCUMENTS

| | | | |
|---|---|---|---|
| 2003/0223919 | A1 | 12/2003 | Kwak et al. |
| 2010/0281866 | A1* | 11/2010 | Reynolds .............. F01N 13/009 60/686 |
| 2012/0204557 | A1* | 8/2012 | Jebasinski ............... F01N 13/10 60/605.1 |

FOREIGN PATENT DOCUMENTS

| | | |
|---|---|---|
| JP | 2010-090828 A | 4/2010 |
| KR | 10-2011-0132678 A | 12/2011 |
| KR | 10-1316526 B1 | 10/2013 |

* cited by examiner

THERMOELECTRIC GENERATING SYSTEM FOR VEHICLE

CROSS-REFERENCE TO RELATED APPLICATION

This application claims the benefit of priority to Korean Patent Application No. 10-2015-0143635, filed on Oct. 14, 2015 with the Korean Intellectual Property Office, the disclosure of which is incorporated herein in its entirety by reference.

TECHNICAL FIELD

The present disclosure relates to a thermoelectric generating system for a vehicle, and more particularly, to a thermoelectric generating system for a vehicle capable of recovering waste heat while maintaining an exhaust gas purification ability.

BACKGROUND

In general, an exhaust gas emitted from a vehicle engine contains unnecessary heat which is not useful, and is discarded in the outside air. However, exhaust may include a large amount of heat, and may account for about 30% of overall fuel consumption.

In a general gasoline or diesel engine, it is known that a quantity of heat of about 30% of the energy of fuel supplied to the engine is used for normal output consumption of the engine, about 30% thereof is a cooling loss, about 30% thereof is an exhaust loss, and about 10% thereof is consumed for driving other auxiliary devices. Since heat of about 30% is included in the exhaust gas is directly discharged and discarded in the air, heat loss can be reduced to enhance efficient operations. Thus, recently, a thermoelectric generator supplying electricity to a vehicle using an exhaust gas of the vehicle and an exhaust heat recovery device recovering heat of an exhaust gas to heat the interior of a vehicle have been used.

A thermoelectric element may refer to an element using a thermoelectric effect for converting a temperature difference between both ends of a device into electricity to thus convert thermal energy into electric energy or allowing electricity to flow in a device to cause a temperature difference between both ends of the device to convert electric energy into thermal energy.

However, if exhaust heat is indiscriminately recovered, a harmful emission emitted from an engine may not be appropriately purified in a catalytic converter. That is, a catalyst cannot smoothly exhibit a purification function until the catalytic converter arrives at a light-off temperature (LOT), increasing an amount of harmful emissions in the exhaust gas. Thus, a system for reducing harmful emissions while also recovering exhaust heat is desirable.

SUMMARY

The present disclosure has been made to solve the above-mentioned problems occurring in the prior art while advantages achieved by the prior art are maintained.

An aspect of the present disclosure is to recover exhaust heat from an exhaust gas of an engine.

Another aspect of the present disclosure is to enable recovery of exhaust heat to not affect exhaust gas purification performance.

The technical subjects of the present disclosure are not limited to the afore-said, and any other technical subjects not described herein will be clearly understood by those skilled in the art from the embodiments to be described hereinafter.

According to an exemplary embodiment of the present disclosure, a thermoelectric generating system for a vehicle may include: an engine for producing power; a thermoelectric module for producing electric energy from thermal energy of an exhaust gas generated by the engine; a purifying device for purifying the exhaust gas generated in the engine; and a controller for driving the thermoelectric module when a temperature of the purifying device arrives at a predetermined operational temperature.

According to another exemplary embodiment of the present disclosure, a thermoelectric generating system for a vehicle may include: an engine for producing power; an exhaust manifold for allowing an exhaust gas generated in the engine to gather therein; a thermoelectric module installed in the exhaust manifold for producing electric energy according to a temperature difference; a cooling module for absorbing thermal energy from the thermoelectric module; an exhaust pipe connected to the exhaust manifold for emitting an exhaust gas; a purifying device disposed in the exhaust pipe for purifying the exhaust gas; and a controller for drive the cooling module when a temperature of the purifying device arrives at a predetermined operational temperature.

Details of embodiments are included in detailed descriptions and drawings.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
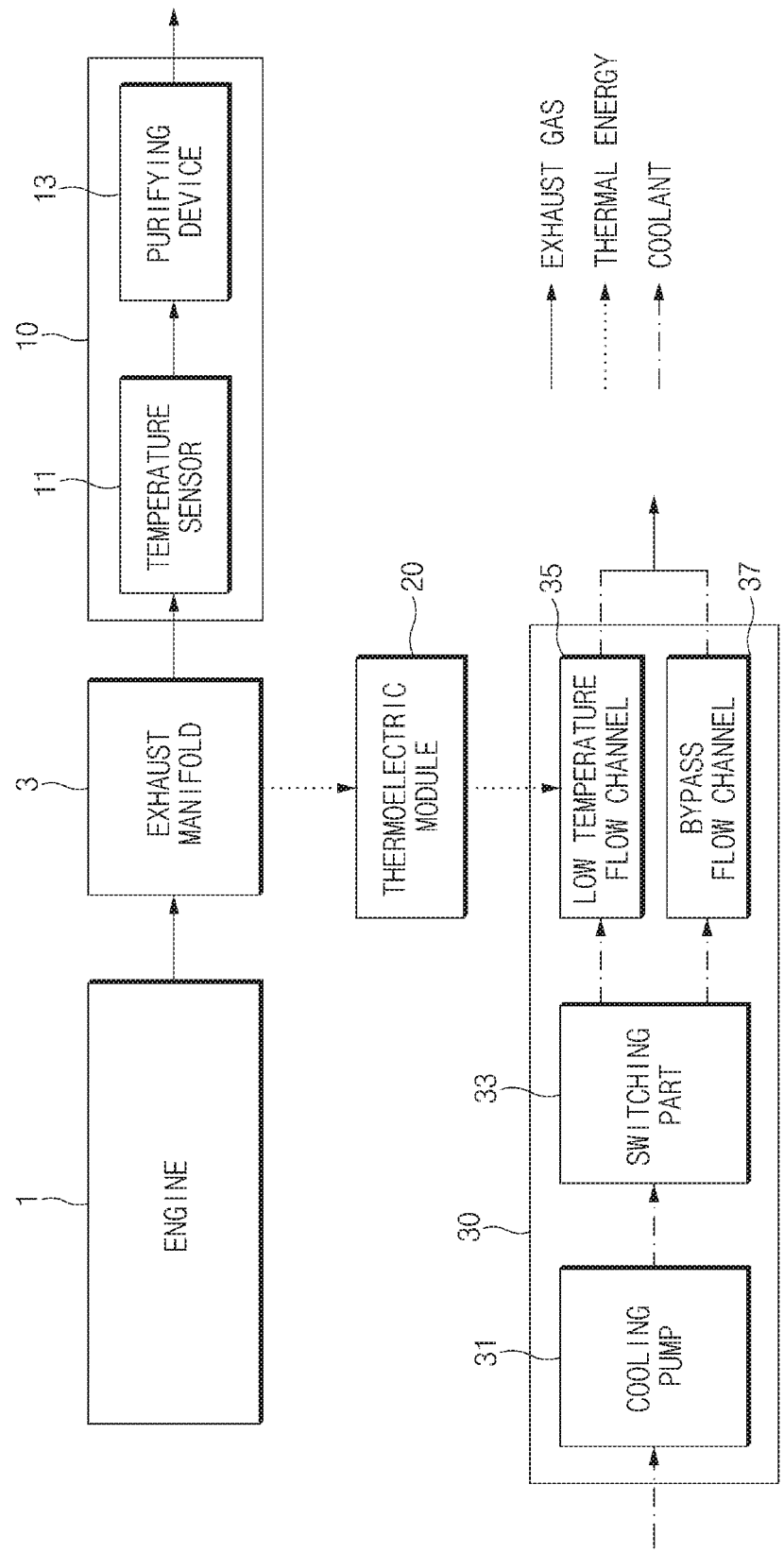
FIG. 1 is a block diagram illustrating relationships of a thermoelectric generating system for a vehicle according to an exemplary embodiment of the present disclosure.

Advantages and features of the present disclosure, and implementation methods thereof will be clarified through following embodiments described with reference to the accompanying drawings.

The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims. Like reference numerals designate like elements throughout the specification.

Hereinafter, a thermoelectric generating system for a vehicle according to exemplar embodiments of the present disclosure will described with reference to the accompanying drawings.

Figure 2:
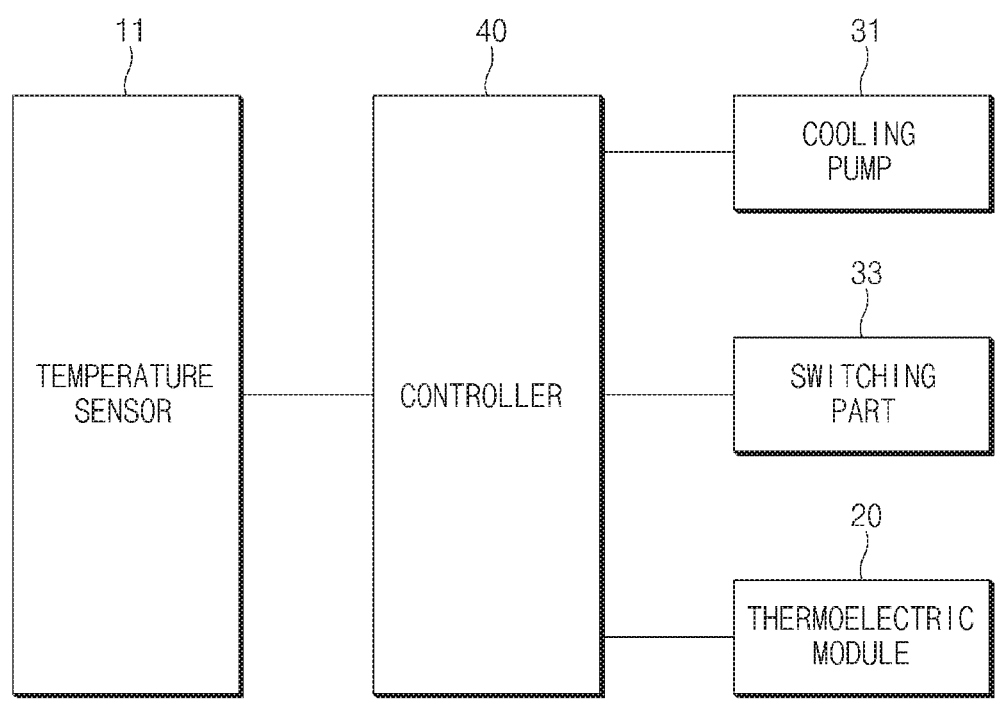
FIG. 2 is a block diagram illustrating relationships between a controller of a thermoelectric generating system for a vehicle according to an exemplary embodiment of the present disclosure and peripheral components thereof.

FIG. 1 is a block diagram illustrating relationships of a thermoelectric generating system for a vehicle according to an exemplary embodiment of the present disclosure, and FIG. 2 is a block diagram illustrating relationships between a controller 40 of a thermoelectric generating system for a vehicle according to an exemplary embodiment of the present disclosure and peripheral components thereof.

Referring to FIGS. 1 and 2, a thermoelectric generating system for a vehicle according to an exemplary embodiment of the present disclosure may include an engine 1 for generating power of a vehicle, a thermoelectric module 20 for generating electric energy from thermal energy of an exhaust gas generated in a plurality of cylinders, a purifying device 13 for purifying an exhaust gas generated in the engine 1, and a controller 40 for driving the thermoelectric module 20 when a temperature of the purifying device 13 arrives at a predetermined operational temperature.

The engine 1 may burn fuel to generate power and emit an exhaust gas. A high temperature part and a low temperature part of, or on, or near, the thermoelectric module 20 may be disposed to be spaced apart from one another on both sides of the thermoelectric module 20. Here, the high temperature part may be an exhaust manifold 3 and the low temperature part may be a cooling module 30 (to be described hereinafter). The operational temperature may be a lowest temperature for the purifying device 13 to perform an adequate exhaust gas purifying function.

When the temperature of the purifying device 13 arrives at the operational temperature, the controller 40 may control an electric device component of the thermoelectric module 20 to allow the thermoelectric module 20 to produce electricity.

The thermoelectric generating system for a vehicle according to an exemplary embodiment of the present disclosure may include the cooling module 30 for absorbing thermal energy from the thermoelectric module 20, and when a temperature of the exhaust gas arrives at the operational temperature, the controller 40 may drive the cooling module 30.

The cooling module 30 may be disposed at the low temperature part of the thermoelectric module 20. The cooling module 30 may form, or have a temperature forming, a temperature difference from the high temperature part, or from the temperature of the high temperature part. The cooling module 30 may be a watercooling type cooling module or an air cooling type cooling module. For example, a watercooling type cooling module may have a cooling pump 31, and an aircooling type cooling module may have a cooling fan.

The thermoelectric generating system for a vehicle according to an exemplary embodiment of the present disclosure may include an exhaust manifold 3 to which an exhaust gas generated by a plurality of cylinders gathers and an exhaust pipe 10 connected to the exhaust manifold 3 to emit the exhaust gas. The thermoelectric module 20 may be installed in the exhaust manifold 3.

The exhaust gas emitted from the engine 1 may flow to the exhaust manifold 3. The thermoelectric module 20 may be installed in the exhaust manifold 3 and configured to absorb thermal energy of the exhaust gas to thus generate electricity energy.

The thermoelectric generating system for a vehicle according to an exemplary embodiment of the present disclosure may include a temperature sensor 11 disposed in the exhaust pipe 10 for measuring a temperature of the exhaust gas, and the controller 40 may perform a controlling operation on the basis of data transmitted from the temperature sensor 11.

The temperature sensor 11 may measure a temperature of the exhaust gas. The temperature of the exhaust gas may be a temperature of a catalyst. The temperature sensor 11 may measure a temperature and transmit corresponding data to the controller 40.

The cooling module 30 may include a cooling pump 31 allowing a coolant to flow therein, and when a temperature of the exhaust gas flowing in the exhaust pipe 10 is increased, the controller 40 may control a rotational speed of the cooling pump 31 to be increased.

The cooling pump 31 may be configured to circulate a coolant therein. When a temperature of the exhaust gas is increased, the controller 40 may control a revolutions per minute (RPM) of the cooling pump 31 to be increased in order to increase a temperature gradient. By increasing the RPM of the cooling pump 31, the controller 40 may increase an efficiency of the thermoelectric module 20.

According to an exemplary embodiment, the cooling module 30 may include a low temperature flow channel 35 heat-exchanged, or able to exchange heat, with the thermoelectric module 20. A switching part 33 may be configured to open and close the low temperature flow channel 35.

When a temperature of the exhaust gas is lower than the operational temperature of the purifying device 13, the controller 40 may control the switching part 33 to close the low temperature flow channel 35, and accordingly, a coolant may not flow to the low temperature flow channel 35, stopping driving of the thermoelectric module 20 and preventing generation of electric energy. When a temperature of the exhaust gas is equal to or higher than the operational temperature of the purifying device 13, the controller 40 may control the switching part 33 to open the low temperature flow channel 35, and accordingly, a coolant may flow to the low temperature flow channel 35 to drive the thermoelectric module 20 to produce electric energy.

According to another exemplary embodiment, the cooling module 30 may include the low temperature flow channel 35 heat-exchanged with, or able to exchange heat with, the thermoelectric module 20, a bypass flow channel 37 bypassing the low temperature flow channel 35, and the switching part 33 opening at least one of the low temperature flow channel 35 and the bypass flow channel 37. The switching part 33 may be configured to selectively open and close the low temperature flow channel 35 and the bypass flow channel 37.

When a temperature of the exhaust gas is lower than the operational temperature of the purifying device 13, the controller 40 may control the switching part 33 to open the bypass flow channel 37 and close the low temperature flow channel 35. Accordingly, the coolant may flow toward the bypass flow channel 37, rather than toward the low temperature flow channel 35, and thus, the thermoelectric module 20 may not be driven and thus electric energy may not be produced. When a temperature of the exhaust gas is equal to or higher than the operational temperature of the purifying device 13, the controller 40 may control the switching part 33 to close the bypass flow channel 37 and open the low temperature flow channel 35. Accordingly, the coolant may flow toward the low temperature flow channel 35 to drive the thermoelectric module 20 to produce electric energy.

The controller 40 may adjust an opening ratio of the bypass flow channel 37 and the low temperature flow channel 35.

The operational temperature may be an activation temperature of a catalyst provided in the purifying device 13. The purifying device 13 may include the catalyst. At a temperature equal to or higher than the activation temperature, the catalyst may perform an exhaust gas purification function. For example, the activation temperature of the catalyst may be 400° C.

After the thermoelectric module 20 is driven, the controller 40 may stop driving the thermoelectric module 20 in an idle stop state in which a vehicle velocity is 0 miles per hour. In the idle stop state, even though the thermoelectric module 20 and the cooling module 30 may be driven, possibly due to idle operation of the engine, the controller 40 may stop driving the thermoelectric module 20 and the cooling module 30.

The thermoelectric generating system for a vehicle according to an exemplary embodiment of the present disclosure may include the engine 1 generating power of a vehicle; the exhaust manifold 3 in which an exhaust gas generated by a plurality of cylinders may gather; the thermoelectric module 20 which may be attached to the exhaust manifold 3 and may generate electric energy according to a temperature difference; the cooling module 30 for absorbing thermal energy from the thermoelectric module 20; the exhaust pipe 10 connected to the exhaust manifold 3 and emitting an exhaust gas; the purifying device 13 disposed in the exhaust pipe 10 and purifying the exhaust gas; and the controller 40 for driving the cooling module 30 when a temperature of the purifying device 13 arrives at a predetermined operational temperature.

The present disclosure has the following advantages.

First, exhaust heat may be recovered from an exhaust gas of an engine.

Second, recovery of an exhaust gas may not affect exhaust gas purification performance.

Advantages and effects of the present disclosure are not limited to the foregoing effects and any other technical effects not mentioned herein may be easily understood by a person skilled in the art from the present disclosure and accompanying drawings.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A thermoelectric generating system for a vehicle, the thermoelectric generating system comprising:
    an engine configured to produce power for the vehicle;
    an exhaust manifold configured to allow an exhaust gas generated in the engine to gather therein;
    an exhaust pipe connected to the exhaust manifold and configured to emit the exhaust gas;
    a purifying device disposed in the exhaust pipe and configured to purify the exhaust gas;
    a thermoelectric module installed in the exhaust manifold and configured to produce electric energy according to a temperature difference;
    a cooling module including a cooling pump allowing a coolant to flow, a low temperature flow channel heat exchanged with the thermoelectric module, a bypass flow channel bypassing the low temperature flow channel, and the switching part configured to selectively open at least one of the low temperature flow channel and the bypass flow channel; and
    a controller configured to drive the thermoelectric module when a temperature of the purifying device arrives at a predetermined operational temperature,
    wherein when a temperature of the exhaust gas is increased, the controller increases a rotational speed of the cooling pump.

2. The thermoelectric generating system according to claim 1,
    wherein when a temperature of the exhaust gas arrives at the operational temperature, the controller drives the cooling module.

3. The thermoelectric generating system according to claim 1, further comprising a temperature sensor disposed in the exhaust pipe and configured to measure a temperature of the exhaust gas,
    wherein the controller performs a controlling operation on the basis of data transmitted from the temperature sensor.

4. The thermoelectric generating system according to claim 1, wherein when a temperature of the exhaust gas is equal to or higher than the operational temperature, the controller controls the switching part to open the low temperature flow channel, and
    when the temperature of the exhaust gas is lower than the operational temperature, the controller controls the switching part to close the low temperature flow channel.

5. The thermoelectric generating system according to claim 1, wherein
    when the temperature of the exhaust gas is equal to or higher than the operational temperature of the purifying device, the controller controls the switching part to open the low temperature flow channel and close the bypass flow channel, and
    when the temperature of the exhaust gas is lower than the operational temperature of the purifying device, the controller controls the switching part to close the low temperature flow channel and open the bypass flow channel.

6. The thermoelectric generating system according to claim 1, wherein the operational temperature is an activation temperature of a catalyst provided in the purifying device.

7. The thermoelectric generating system according to claim 1, wherein after the thermoelectric module is driven, the controller stops driving the thermoelectric module in an idle stop state in which a vehicle velocity is 0.

* * * * *